United States Patent [19]

Welbourn et al.

[11] Patent Number: 5,656,507
[45] Date of Patent: Aug. 12, 1997

[54] PROCESS FOR SELF-ALIGNING CIRCUIT COMPONENTS BROUGHT INTO ABUTMENT BY SURFACE TENSION OF A MOLTEN MATERIAL AND BONDING UNDER TENSION

[75] Inventors: Anthony David Welbourn, Ipswich; Kenneth Cooper, Stowmarket, both of United Kingdom

[73] Assignee: British Telecommunications public limited company, London, United Kingdom

[21] Appl. No.: 256,939

[22] PCT Filed: Jan. 20, 1993

[86] PCT No.: PCT/GB93/00121

§ 371 Date: Oct. 4, 1994

§ 102(e) Date: Oct. 4, 1994

[87] PCT Pub. No.: WO93/15424

PCT Pub. Date: Aug. 5, 1993

[30] Foreign Application Priority Data

Jan. 28, 1992 [EP] European Pat. Off. ............. 92300714

[51] Int. Cl.$^6$ ............................ H01L 21/58; G02B 6/42
[52] U.S. Cl. ........................ 385/14; 228/180.22; 438/25; 438/26; 438/975
[58] Field of Search ..................... 257/779, 797; 228/180.22; 437/2, 4, 924, 984, 183, 209; 29/25.01

[56] References Cited

U.S. PATENT DOCUMENTS

| | | | |
|---|---|---|---|
| 4,288,808 | 9/1981 | Hantusch | 357/68 |
| 4,545,610 | 10/1985 | Lakritz et al. | 29/589 |
| 4,565,314 | 1/1986 | Scholz | 228/180.22 |
| 4,810,557 | 3/1989 | Blonder | 428/156 |
| 4,878,611 | 11/1989 | Lovasco et al. | 228/180.22 |
| 4,892,377 | 1/1990 | Randle | 350/96.2 |
| 4,904,036 | 2/1990 | Blonder | 350/96.11 |
| 4,949,148 | 8/1990 | Bartelink | 357/74 |
| 5,023,881 | 6/1991 | Ackerman et al. | 372/46 |

FOREIGN PATENT DOCUMENTS

| | | |
|---|---|---|
| 0150929 | 8/1985 | European Pat. Off. . |
| 0223414 | 5/1987 | European Pat. Off. . |
| 463297 | 3/1991 | Germany . |
| 59155162 | 9/1984 | Japan . |
| 2215087 | 9/1989 | United Kingdom . |
| 8701509 | 3/1987 | WIPO . |

OTHER PUBLICATIONS

"Self Aligned Flip–Chip Assembly of Photonic Devices with Electrical and Optical Connections", Wale, M.J. 1990 Proceedings 40th Electronic Components and Technology Conference, New York, NY, USA; IEEE, 1990, pp. 34–41 vol. 1.

Wale, "Self Aligned Flip Chip Assembly of Photonic Devices with Electrical and Optical Connections", Proceedings of the 40th Electronic Components & Technology Conference, 20 May 1990, Las Vegas, pp. 34–41.

*Primary Examiner*—David E. Graybill
*Attorney, Agent, or Firm*—Nixon & Vanderhye P.C.

[57] ABSTRACT

A method is disclosed for connecting two components with functional parts in a predetermined alignment such as a semiconductor laser and motherboard including forming the laser by processing in which a radiation outlet and alignment structure are provided in a predetermined position with respect to each other, similarly forming on the motherboard, a waveguide and alignment structure, mounting the laser on the motherboard in a generally aligned position, providing solder between metal pads on the laser and motherboard and utilizing the surface tension of the molten metal extending between the pads to move the laser into an accurately aligned position on the motherboard.

31 Claims, 1 Drawing Sheet

PROCESS FOR SELF-ALIGNING CIRCUIT COMPONENTS BROUGHT INTO ABUTMENT BY SURFACE TENSION OF A MOLTEN MATERIAL AND BONDING UNDER TENSION

This invention relates to the alignment of components such as integrated optical components.

BACKGROUND OF THE INVENTION

Field of the Invention

Difficulties are commonly experienced in mounting together integrated optical components (such as a semiconductor laser with optical fibres or planar waveguides, detectors, fibre amplifiers and the like), with sufficient accuracy.

One of the most demanding situations is the provision of accurate alignment between a laser and waveguides. As an example of this requirement, the case of a semiconductor laser coupling to an AsG waveguide has been considered. For maximum power transfer, the laser and guide should exactly butt together. The coupling efficiency is limited by the mismatch in the mode sizes of the two components. For the structures of current interest, this results in an efficiency of 45% or a loss of 3.5 dB.

In practice, it is not possible to achieve exact butt coupling and it is therefore necessary to determine the optimum separation between the laser and the guide where axial alignment sensitivity is at its lowest. For signalling type applications, a coupling efficiency between the laser and waveguide of 10% or a loss of 10 dB is seen as the minimum acceptable value. Taking this figure as a target specification, the maximum horizontal and vertical misalignment allowable has been calculated as a function of separation between the laser and the waveguide. For the current case, it was found that a separation of 6 µm gave the lowest sensitivity to axial misalignment (1.7 µm or 1.9 µm in the vertical or horizontal directions before loss in excess of the target value was obtained).

These calculations do not take into account any angular deviation between the laser and the waveguide and so should be viewed as a "best case" estimate. As a result, the alignment tolerance sought in a motherboard process was taken as less than 1 µm in both the horizontal and vertical directions. If higher coupling efficiencies than 10% are required, (eg in the case of laser pumping for optical amplifiers), it would be necessary to match the mode sizes of the two components by use of, for example, a lensed laser assembly.

It has been known to join two-integrated circuits or chips by a so called "flip-chip" solder bonding technique. The faces of the two integrated circuits which are to be joined each contain a corresponding pattern of metal pads, and one of the integrated circuits is provided with a solder bump on each metal pad, the two integrated circuits are approximately aligned, the solder is melted, and the solder, by surface tension, moves the two integrated circuits into alignment so that the corresponding metal pads on each integrated circuits are exactly aligned. The alignment is determined by the metal pads themselves. While this provides a fairly accurate way of aligning two components, in particular in a case with flip-chips where the two integrated circuits are to be interconnected electrically, as determined above, greater accuracy of alignment is required in aligning integrated optical components.

SUMMARY OF THE INVENTION

The present invention provides, according to one aspect, a method for connecting two components together with functional parts thereof in a predetermined alignment, comprising:

processing said first component to form a first functional part and a first alignment means in a predetermined position with respect to said first functional part, providing a pad in a predetermined position on the surface of said first component, processing said second component to form a second functional part and a second alignment means in a predetermined position with respect to said second functional part, providing a pad in a predetermined position on the surface of said second component, providing a meltable solid on one of said pads the meltable solid being of a material which preferentially adheres to the pad, generally aligning the two components, melting the meltable solid so that it interconnects adjacent pads on the two components, the disposition of the first and second alignment means and metal pads being such that the surface tension of the molten solid in contact with adjacent pads on the two components urges the two components into a relative position so that the first and second alignment means abut each other and thereby accurately align so that the first and second functional parts are thus in a predetermined alignment.

Preferably, said pads are disposed so that when said two components are aligned, the surface tension of said molten solid continues to provide a component of force which urges the alignment means into contact with each other.

Preferably, in respect of one or both components, the functional parts are also defined by the same etching step as the alignment means.

There are very considerable advantages in the method of the invention. Thus the alignment means will be reproducibly accurately aligned with the functional part of the component as they are made by the same process. Thus for example, where one of the components is a semiconductor laser, the radiation output of the laser (which is the functional part), is defined in an etching process step which may also be used to provide the alignment means. Similarly, if the component is a silicon motherboard, the input of a waveguide (which for this purpose is the functional part) is defined in our etching step which is also used to define the alignment means.

The method is compatible with conventional silicon processing, that is wet and dry etching and photolithography requirements.

In accordance with conventional techniques, the etching may be carried out after a resist layer has been laid on the surface by photolithography.

In a preferred arrangement, each component may include two alignment means, to operate in orthogonal directions.

The alignment means may comprise a protrusion, an edge, or a slot. In a preferred arrangement, one of the components may comprise a substrate of crystalline material which contains intersecting planes which can be delineated by etching, the etching of the alignment means forming the alignment means.

The present invention also provides in combination, two components mounted together, each component comprising a functional part and an alignment means in a predetermined position with respect of said functional part, each component including a pad in a predetermined position on its surface, said two components being interconnected by a molten solid extending between adjacent pads on the two components, said combination being formed in accordance with a method as claimed.

BRIEF DESCRIPTION OF THE DRAWINGS

The invention will now be described by way of example only and with reference to the accompanying drawings in which.

DETAILED DESCRIPTION OF EXEMPLARY EMBODIMENTS

Figure 1:
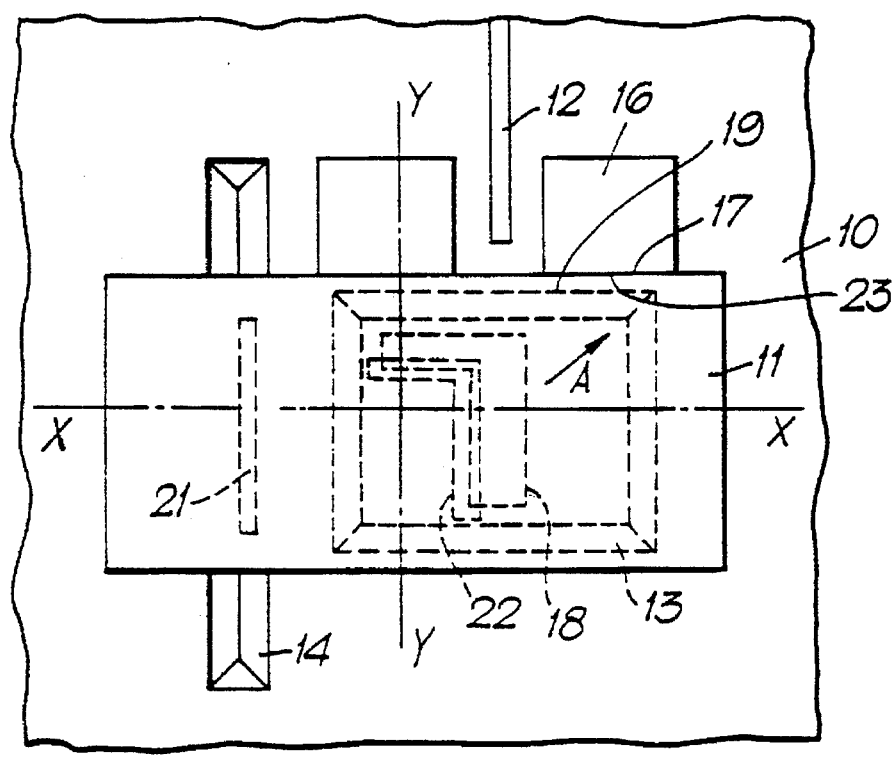
FIG. 1 is a diagrammatic plan view of part of a motherboard with semiconductor laser mounted thereon in accordance with a method of the invention.

Referring to FIG. 1 there is shown a silicon motherboard 10 on top of which is to be mounted a semiconductor laser 11. In the process of the invention, various components are formed on the silicon of the motherboard 10, for example, a waveguide 12. The optical waveguide 12 is defined on a silicon motherboard by a lithographically patterned AsG core surrounded by an undoped silicon dioxide cladding. This combination of glasses can be processed conveniently at low temperatures, and owing to their large index difference, allow the fabrication of low loss, small radius bends which permit a high component density on the motherboard.

The process sequence includes initially forming the recess 13 by a micromachining or wet etch process. The waveguide 12 is produced by a wet etch process using a KOH chemically etched recess (typically 7 μm deep) which is partially filled with a PECVD undoped silicon oxide for the low cladding or buffer layer. The waveguide core is formed by a 2 μm thick AsG layer which is dry (plasma) etched and reflowed in an oxidizing atmosphere at temperatures between 950° C. and 1000° C. This plasma dry etching process also defines a mask for subsequently forming the slot 14 to be referred to later. The end of the waveguide which needs to be accurate is formed by plasma etching.

A 4 to 6 μm undoped oxide is deposited to surround the waveguide core. Potential difficulties arising from cavities between the core and cladding may be minimised by using planarising techniques.

Micromachining or wet etching is then used through the defined mask to form the V groove 14 which is thereby accurately aligned with the waveguide 12.

The recess 13 and V groove 14 are both formed by micromachining by an anisotropic etching process using an etchant such as KOH or ethylene diamine pyrocatechol and water (EDP). With such etchants, some crystal planes in silicon etch much more slowly than others. Consequently when a masking window is aligned correctly along the intersections of two such planes with the surface of the silicon, etching terminates at these planes and a V shaped groove results. Since these planes are related directly to the crystallographic structure of the silicon, the angle and direction of the recess 13 or V groove 14 are very tightly controlled. The width of the V groove can therefore be controlled very accurately, typically to a tolerance of 0.25 to 0.5 μm. As the mask window for the V groove 14 is etched in the same step as the waveguide 12 is etched, the position of the V groove 14, and in particular the sides of the V groove 14 can be accurately predetermined with respect to the position of the waveguide 12, by utilizing photolithography.

It will be seen from FIG. 1 that the V groove 14 is straight (as would be expected as it is along a crystal plane) and of a suitable depth as will be determined.

There is also provided on the top surface of the motherboard 10 a pair of polysilicon stops 16 which are formed by providing a layer of polysilicon and etching away (before the wet etching of the "V" groove 14 and just before the plasma etch of the end surface of the waveguide) the remainder of the layer to provide the polysilicon stops. Once again, because the polysilicon stops are provided by means of an etching process through a mask, the edges 17 of the polysilicon stop 16 will be accurately aligned with, for example, the input of the waveguide 12.

A metal pad 18 of "L" shape is laid down in the recess 13, in a manner well known in semiconductor technology, one leg of the pad extending parallel to the V groove and the other leg extending parallel to the edges 17 of the polysilicon stops 16.

Referring now to the semiconductor laser 11, there is provided an active region (viz, output) at which the laser radiation is outputted adjacent the waveguide 12. The under surface of the semiconductor laser, includes a ridge 21 downwardly depending from its lower surface. The ridge 21 is produced by an etching process, the etching being carried out as described above. As the active region 19 of the laser is also defined by an etching process, the alignment of the active region 19 and the ridge 21 is predetermined by the masks used in the etching process and can therefore be accurately determined.

There is also laid down on the under surface of the laser 11 a metal pad 22 which is of similar shape and extent to the metal pad 18, that is, "L" shaped with a first leg parallel to the ridge 21 and a second leg parallel to an edge 23 of the laser, except that the width of the legs of the pad 22 are smaller, typically one third, of the width of the legs of the pad 18.

The position, and shape of the metal pads 18 and 22 is defined in the manufacture of the relevant component by photolithography through a suitable mask. Furthermore, the metal pads are made of, or coated with, a metal which is wetted by molten solder.

When the motherboard and laser are correctly aligned, as is exaggerated in the view of FIG. 1, the metal pad 22 is, in the view of FIG. 1, slightly below and to the left of the metal pad 18.

Before assembly of the motherboard 10 and the semiconductor laser 11, the metal pad 22 is provided with solder 26 in the form of a solder bump.

Figure 2:
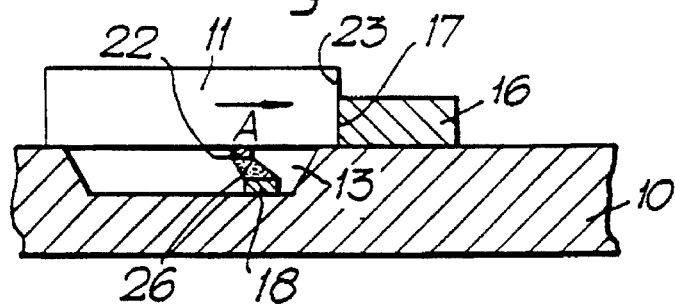
FIG. 2 is a section of FIG. 1 on line Y—Y, and, FIG. 3 is a section of FIG. 1 on line X—X.
Figure 3:
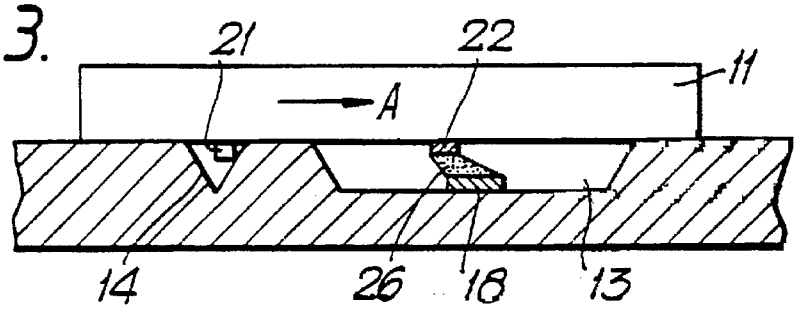

To assemble the semiconductor laser 11 to the motherboard 10, the laser 11 is laid onto the motherboard in approximate alignment with its final position. In practice, the laser 11 will naturally rest below and to the left of the final position in FIG. 1, because it cannot rest on top of the polysilicon stops 16 and the ridge 21 will naturally rest somewhere towards the middle of the V groove 14. The solder is then melted, and by means of surface tension effects (see solder 26 in FIGS. 2 and 3), will interconnect the two metal pads 18 and 22, and draw the laser 11 in the direction of the arrow A in the Figures so that the ridge 21 engages against the right side of the V groove 14 as shown in FIG. 3 and the edge 23 of the laser abuts the edges 17 of the polysilicon stop 16. In this way the semiconductor laser 11 is accurately aligned with the motherboard 10 so that the active region 19 is accurately aligned with the waveguide 12.

In the final aligned position of the laser 11 and motherboard 10, it may be arranged that the two metal pads 18,22 exactly align with one another. Alternatively, it can be arranged that the metal pad 22 may, when viewed in FIG. 1, be arranged to be below and to the left of the metal pad 18 (exaggerated in the Figures) whereby even when the laser 11 and motherboard 10 are correctly aligned, there will be some residual slight force caused by the surface tension effects of the molten solder, urging the laser 11 in an direction of arrow A.

In some circumstances, it may be that the laser 11 may have a large surface overlapping and laying on the motherboard 10 and there may be frictional forces to be overcome if the laser and motherboard are to be moved relative to one another. In this case, one solution is for the quantity of solder in each solder bump to be greater than otherwise so that when the solder melts, there is sufficient solder to cause the laser 11 to be lifted above the motherboard 10 to thereby eliminate friction. The amount by which the laser is lifted above the motherboard is preferably very small, typically 1 μm and therefore the amount of solder in each solder bump should be carefully calculated to provide that exact clearance between the laser and motherboard. In this way, by eliminating friction particularly to zero, the surface tension effect is sufficient to move the laser with respect to the motherboard exactly into alignment as above described.

We have therefore provided a method of connecting external components such as lasers, detectors, and/or other optical integrated circuits to a motherboard. The process is compatible with conventional silicon processing and photolithography. The use of surface tension in molten solder to move the semiconductor laser 11 into correct alignment with the motherboard 10 enables one to use a controlled force to move the laser. Excessive force could cause damage to the alignment means, in particular the ridge 21 which might easily be damaged or broken.

In an alternative arrangement, the pad 18 may also be made thinner than the pad 22 in which case their orientations would need to be rotated by 180° in respect of the view in FIG. 1.

The invention is not restricted to the details of the foregoing example.

The two pads 18 and 22 are shown "L" shaped in the present arranged. However the two pads could be other shapes, for example rectangular but they should have the relative orientation shown in FIG. 1, that is the pad 18 is (in the plane of the drawing) further up and to the right with respect to the pad 22.

The invention is not restricted to the details of the foregoing example.

We claim:

1. A method for connecting two components together with functional parts thereof in alignment, said method comprising:

processing a first component to form a first functional part and a first alignment means, providing a pad on a first surface of said first component, processing a second component to form a second functional part and a second alignment means, providing a pad on a first surface of said second component, providing a meltable solid on one of said pads, the meltable solid being of a material which adheres to the pads, stacking the two components with said first surfaces juxtaposed, melting the meltable solid so that it interconnects adjacent pads on the two components, the disposition of the first and second alignment means and metal pads being such that the surface tension of the molten solid in contact with adjacent pads on the two components urges the two components to move laterally along said juxtaposed first surfaces so that the first and second alignment means abut each other and thereby accurately align so that the first and second functional parts also are in alignment.

2. A method as in claim 1 wherein said pads are disposed so that when said two components are aligned, the surface tension of said molten solid continues to provide a component of force which urges the first and second alignment means into contact with each other.

3. A method as in claim 1 wherein:

the location of said alignment means of at least one of said components is defined by etching a mask; and the functional part of said at least one components is also at least partly defined by the same etching step.

4. A method as in claim 1 wherein each of said components are processed to provide two alignment means which are disposed in mutually orthogonal directions.

5. A method as in claim 1 wherein at least one of said alignment means comprises a protrusion.

6. A method as in claim 1 wherein at least one of said alignment means comprises an edge.

7. A method as in claim 1 wherein at least one of said alignment means comprises a slot.

8. A method as in claim 1 wherein at least one of said components comprises a substrate of crystalline material containing interacting planes which can be delineated by etching, the etching of the component forming said alignment means.

9. A method as in claim 1 wherein said two components comprise integrating optical components.

10. A method as in claim 1 wherein one of said components includes a semiconductor laser and the other includes a waveguide.

11. In combination, two components mounted together, each component comprising a functional part and an alignment means in a position with respect to said functional part, each component including a pad on its surface, said two components being interconnected by a molten solid extending between adjacent pads on the two components, said combination being formed in accordance with a method as in claim 1.

12. An integrated optical apparatus comprising:

two integrated optical components mounted together, a first said component including a semiconductor laser and a second said component including a waveguide, the first component including an output of the semiconductor laser and an alignment means provided in a position with respect to said output, the second component including a waveguide input and an alignment means provided in a position with respect to said waveguide input, each component including a pad in a position on its surface, said two components being interconnected by a molten solid extending between adjacent pads on the two components, said integrated optical apparatus being formed in accordance with a method as in claim 1 whereby the output and the waveguide input are aligned.

13. A method of connecting two components together in stacked relation, comprising:
    (a) forming a first component with a first stop structure and a second component with a complementary second stop structure;
    (b) providing a pad on a surface of each of the components;
    (c) providing a meltable solid on one of the pads, the meltable solid being a material which, when molten, adheres to a pad in preference to material immediately surrounding the pad;
    (d) stacking the components with their pad bearing surfaces facing each other and with the pads offset with respect to each other; and
    (e) melting the meltable solid so that it connects the pads, wherein the pads are disposed such that, when the solid is melted, its surface tension urges laterally the components relative to each other so that complementary stop structures engage each other thereby establishing a alignment between the components.

14. A method according to claim 13, wherein the pads are disposed such that the surface tension in the melted solid continues to urge the components relative to each other after the complementary stop structures have engaged each other.

15. A method according to claim 13, further comprising forming a first functional part on the first component and forming a second functional part on the second component, the first and second functional parts being arranged to be aligned when said alignment has been established.

16. A method according to claim 15, wherein at least one of the functional parts is formed in an etching process also forming a window to define the location of one of the stop structures.

17. A method according to claim 13, wherein step (a) further comprises forming the first component with a third stop structure and the second component with a complementary fourth stop structure, the first and second stop structures and the third and fourth stop structures engaging each other to establish alignment between the components in two orthogonal dimensions.

18. A method according to claim 13, wherein at least one of the stop structures comprises a protrusion.

19. A method according to claim 13, wherein at least one of the stop structures comprises an edge.

20. A method according to claim 13, wherein at least one of the stop structures comprises a slot.

21. A method according to claim 13, wherein the first component comprises the substrate of crystalline material, containing intersecting planes which can be delineated by etching, and step (a) comprises etching the first component to form a stop structure.

22. A method according to claim 13, comprising step of forming integrated optical elements on the first and second components.

23. An assembly comprising two components together in stacked relation formed according to claim 13.

24. An assembly according to claim 23, including an optical element on each of the components, the optical elements being aligned for the transmission of light therebetween.

25. An assembly according to claim 24, wherein one optical element is a semiconductor laser and the other optical element is an optical waveguide.

26. An assembly comprising:
    a first component having a first stop structure;
    a second component in stacked relation to the first component and having a complementary second stop structure engaging the first stop structure; and
    a bridge of solder material extending between a first pad on the first component and a second pad on the second component, wherein the first pad is displaced relative to the second pad in a direction away from the first stop structure.

27. An assembly according to claim 26, including au optical element on each of the components, the optical elements being aligned for the transmission of light therebetween.

28. An assembly according to claim 27, wherein one optical element is semiconductor laser and the other optical element is an optical waveguide.

29. A method for aligning first and second optical signal components that are respectively incorporated into first and second integrated optical circuit chips also having integrated first and second alignment structures, said method comprising the steps of:
    providing a first bonding pad on one side of said first chip;
    providing a second bonding pad on one side of said second chip;
    said first and second bonding pads being positioned so as to be offset with respect to one another when said first and second components are aligned;
    providing a supply of fusible bonding material on at least one of said bonding pads;
    stacking said chips together so that said first and second bonding pads are at least partially overlapping on opposingly situated parallel planes;
    temporally melting said bonding material to produce surface tension forces producing lateral movement between said chips as needed to cause said first and second alignment structures to abut.

30. A plurality of integrated optical circuit chips aligned and connected together in accordance with the method of claim 29.

31. A method of aligning, and joining together a pair of integrated optical circuit chips having mutually mated alignment stop surfaces and at least one pair of partially offset bonding pads disposed on the surfaces to be aligned and joined, said method comprising the steps of:
    stacking said chips with said surfaces juxtaposed and with molten bonding material adhering to said pads creating surface tension forces biasing said alignment stop surfaces into abutment; and
    thereafter solidifying said bonding material to join said stacked and thus aligned chips.

* * * * *